US006963157B2

(12) United States Patent
Sato et al.

(10) Patent No.: US 6,963,157 B2
(45) Date of Patent: Nov. 8, 2005

(54) LEAD ZIRCONATE TITANATE FIBER, SMART BOARD USING LEAD ZIRCONATE TITANATE FIBER, ACTUATOR UTILIZING SMART BOARD, AND SENSOR UTILIZING SMART BOARD

(75) Inventors: Hiroshi Sato, Tsukuba (JP); Yoshiro Shimojo, Tsukuba (JP); Tadashi Sekiya, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 10/347,248

(22) Filed: Jan. 21, 2003

(65) Prior Publication Data
US 2003/0141785 A1 Jul. 31, 2003

(30) Foreign Application Priority Data

| Jan. 21, 2002 | (JP) | ............................. 2002-011999 |
| Mar. 6, 2002 | (JP) | ............................. 2002-061072 |

(51) Int. Cl.⁷ ........................................... H01L 41/08
(52) U.S. Cl. ..................................... 310/367; 310/369
(58) Field of Search ................................. 310/367, 369

(56) References Cited

U.S. PATENT DOCUMENTS

| 3,820,208 A | * | 6/1974 | Baldy ........................ 29/25.35 |
| 4,278,000 A | * | 7/1981 | Saito et al. .................... 84/731 |
| 5,064,596 A | | 11/1991 | Chida et al. ................. 264/181 |
| 5,914,507 A | | 6/1999 | Polla et al. .................. 257/254 |
| 5,945,029 A | | 8/1999 | Scholz et al. ........... 252/62.9 R |
| 6,703,766 B2 | * | 3/2004 | Duerr ......................... 310/340 |

FOREIGN PATENT DOCUMENTS

| DE | 40 33 089 C1 | | 3/1992 | ......... H01L 41/087 |
| EP | 1 132 978 A1 | | 9/2001 | ......... H01L 41/083 |
| JP | 10-182153 A | | 7/1998 | .......... C01G 23/04 |
| JP | 10-226570 A | | 8/1998 | ........... C04B 35/49 |
| JP | 11-31857 A | | 2/1999 | ......... H01L 41/087 |
| JP | 2000-150288 | * | 5/2000 | ............. H01G 4/12 |
| JP | 2000-150295 | * | 5/2000 | ............. H01G 4/12 |
| JP | 2002-12423 A | | 1/2002 | .......... C01G 25/00 |
| JP | 2002-12424 A | | 1/2002 | .......... C01G 25/00 |
| JP | 2002-12426 A | | 1/2002 | .......... C01G 25/02 |
| KR | 2002076503 A | * | 10/2002 | ............. H04R 7/00 |
| WO | WO 90/13149 A1 | | 11/1990 | .......... H01L 41/24 |

* cited by examiner

Primary Examiner—Thomas M. Dougherty
(74) Attorney, Agent, or Firm—Birch, Stewart, Kolasch & Birch, LLP

(57) ABSTRACT

A PZT fiber is formed by using a titanium wire or a heat-resistant metal wire made of platinum or the like, as a core wire, and overlaying PZT crystals on a surface of the wire. A smart board utilizing the PZT fiber is formed by embedding the PZT fiber into a conductive composite material layer made of carbon fiber reinforced plastic or the like. An actuator utilizing the smart board is constituted by applying a voltage between the PZT fiber and the conductive composite layer of the smart board.

16 Claims, 8 Drawing Sheets

The fiber is expanded to be deformed.

The composite structure is bent to be deformed.

↓ Electric Field

The fiber is expanded to be deformed.    The composite structure is bent to be deformed.

Block diagram

LEAD ZIRCONATE TITANATE FIBER, SMART BOARD USING LEAD ZIRCONATE TITANATE FIBER, ACTUATOR UTILIZING SMART BOARD, AND SENSOR UTILIZING SMART BOARD

FIELD OF THE INVENTION

The present invention relates to a lead zirconate titanate (referred to as "PZT" hereinafter in cases) fiber applicable to a constructed structure such as a building and a vehicle including an automobile, a vessel and an aircraft; a smart board utilizing the PZT fiber; an actuator utilizing the smart board; and a sensor utilizing the smart board. In particular, the present invention relates to a PZT fiber, a smart board utilizing the PZT fiber, an actuator utilizing the smart board, and a sensor utilizing the smart board. According to the board, it is possible to improve the reliability of a constructed structure and reduce maintenance cost, by preventing fatigue failure due to vibration of the structure, by preventing unstable vibration from occurrence, and by improving riding quality for a vehicle or craft.

BACKGROUND OF THE INVENTION

In recent years, research and development of the smart board, which is composed by integration of a sensor and an actuator with a structure, have attracted much attention from various industries. Smart boards have been regarded as the targeted forms for research and development of various structural materials. Among the structural materials, a piezoelectric material has two effects: a positive piezoelectric effect, that converts mechanical input into electrical output, and a reverse piezoelectric effect, that converts electrical input into mechanical output. Research into embedding the piezoelectric material into a structure as a sensor or an actuator has been actively conducted. Research into embedding a piezoelectric material in a fibrous form into a composite material has been continued mainly at MIT in US, and also in Japan and other countries. This has been already utilized for skis and tennis rackets.

However, it is necessary to form an inter-digital electrode to drive a conventionally usable ceramic fiber, which disadvantageously increases cost. Further, if a conventional PZT-based piezoelectric material is used for the structure, the structure is disadvantageously hard and tends to crack, because of the properties in characteristic of ceramics. Although a structure that utilizes a polymer-type piezoelectric material is hardly confronted with the problem of cracking, the structure has a disadvantage in that the performance of the structure itself is inferior to that utilizing a PZT-based piezoelectric material.

SUMMARY OF THE INVENTION

According to the present invention, there is provided a lead zirconate titanate fiber formed by coating of lead zirconate titanate crystals to a surface of a metal wire serving as a core wire.

Further, in according to the present invention, there is provided a smart board, utilizing the lead zirconate titanate fiber as defined above, with the smart board being formed by embedding the lead zirconate titanate fiber into a conductive composite material layer, too.

Furthermore, in regard with the present invention, there is provided an actuator utilizing the smart board as defined above, with the actuator being constituted by applying a voltage between the lead zirconate titanate fiber and the conductive composite material layer.

Still further, by the present invention, there is provided a sensor utilizing the smart board as defined above, with the sensor being constituted by connecting a voltage sensor to the smart board.

Further, by the present invention, there is provided a method of utilizing the smart board defined above as an actuator or sensor, which functions by applying a voltage between the lead zirconate titanate fiber and the conductive composite material layer.

Furthermore, by the present invention, there is also provided use of the smart board defined above as an actuator or sensor, which functions by applying a voltage between the lead zirconate titanate fiber and the conductive composite material layer.

Other and further features and advantages of the invention will appear more fully from the following description, take in connection with the accompanying drawings.

DETAILED DESCRIPTION OF THE INVENTION

Figure 1:
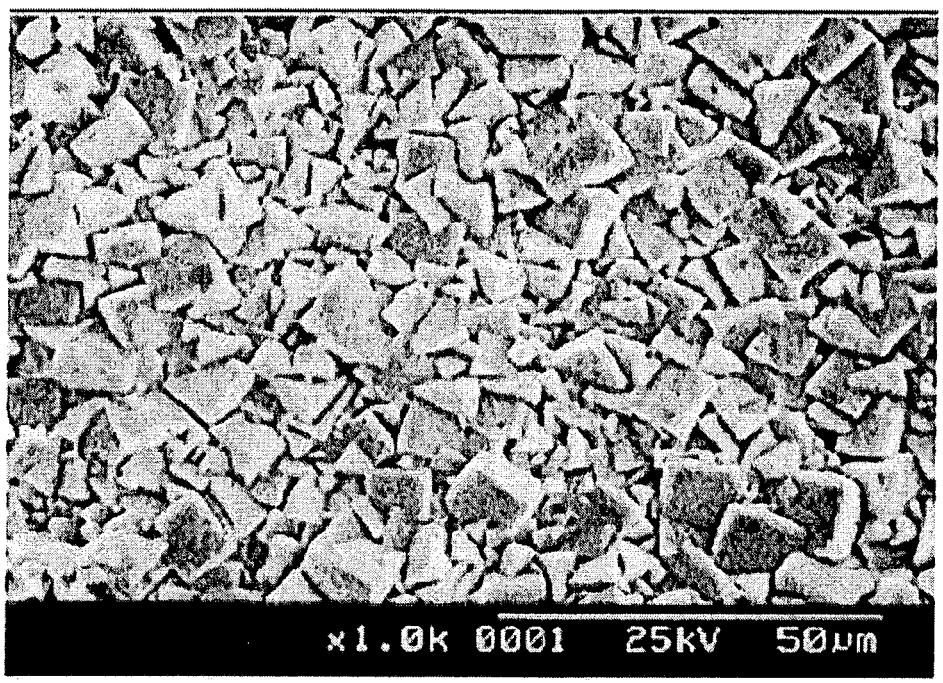
FIG. 1 is a scanning electron microscope photograph showing the surface of a PZT fiber formed by hydrothermal synthesis method in the first embodiment according to the present invention.

According to the present invention, the following means are provided:

(1) A lead zirconate titanate fiber formed by coating or overlaying lead zirconate titanate crystals on a surface of a metal wire serving as a core wire;

(2) The lead zirconate titanate fiber according to the above-mentioned (1), wherein the metal wire is a titanium wire;

(3) The lead zirconate titanate fiber according to the above-mentioned (2), wherein the surface of the titanium wire is coated with lead zirconate titanate crystals by hydrothermal method;

(4) The lead zirconate titanate fiber according to the above-mentioned (1), wherein the metal wire is a heat-resistant metal wire;

(5) The lead zirconate titanate fiber according to the above-mentioned (4), wherein the heat-resistance metal wire is constituted of at least one selected from platinum, stainless steel and nickel;

(6) The lead zirconate titanate fiber according to the above-mentioned (4), wherein the surface of the titanium wire is coated with lead zirconate titanate crystals by extrusion molding;

(7) A smart board utilizing the lead zirconate titanate fiber as defined in the above-mentioned (1), with the smart board being formed by embedding the lead zirconate titanate fiber into a conductive composite material layer;

(8) A smart board according to the above-mentioned (7), wherein the conductive composite material layer is constituted of a carbon fiber reinforced plastic;

(9) An actuator utilizing the smart board as defined in the above-mentioned (7), with the actuator being constituted by applying a voltage between the lead zirconate titanate fiber and the conductive composite material layer; and

(10) A sensor utilizing the smart board as defined in the above-mentioned (7), with the sensor being constituted by connecting a voltage sensor to, for example one end of, the smart board.

Embodiments of the present invention will be described hereinafter with reference to drawings.

In an embodiment of the present invention, a PZT crystal film, which has a very strong piezoelectric effect, is formed on the surface of a metal wire, by hydrothermal synthesis method. Ohba et. al, at Tokyo Institute of Technology, in 1991, reported that a PZT polycrystalline film could be directly formed on a Ti substrate by using a hydrothermal synthesis method (JJAP, "Preparation of Lead Zirconate Titanate Thin Film by Hydrothermal method" vol. 31, No. 9B September 1991 pp. 2174–2177). PZT polycrystalline films of this type have been used for tactile sensors, vibratory gyro-sensors, and the like.

According to hydrothermal synthesis method, lead nitrate, zirconium oxide chlorides and titanium tetrachloride are mixed with a potassium hydroxide solution (usually aqueous solution), and the resultant mixed solution, as well as a titanium substrate, as a film formation target, is put in a pressure vessel. By keeping this pressure vessel at a high temperature and a high pressure, $Pb^{2+}$, $Zr^{4+}$, $Ti^{4+}$ ions in the solution react with the titanium substrate, and a PZT polycrystalline film grows on the surface of the substrate. The ratio of Pb, Zr to Ti of the PZT polycrystalline film to be formed can be controlled by the concentrations of the compounds as sources of the elements in the aqueous solution. In addition, by repeating this reaction, the thickness of the polycrystalline film to be formed can be controlled.

In the hydrothermal synthesis, a titanium substrate is immersed into a mixed solution, for example, of lead nitrate, zirconium oxide chloride, titanium tetrachloride and potassium hydroxide to make a PZT film. These compounds are ionized in the mixed solution, as mentioned above, respectively. Therefore, a PZT crystal grows on the surface of Ti substrate according to the following formula (1).

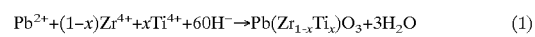

$$Pb^{2+}+(1-x)Zr^{4+}+xTi^{4+}+6OH^{-} \rightarrow Pb(Zr_{1-x}Ti_x)O_3+3H_2O \qquad (1)$$

In this formula, x is more than 0 (zero) and less than 1. When x equals to 0.48, the obtained PZT ceramic shows a very strong piezoelectric effect.

The obtained piezoelectric material has a very strong piezoelectric effect, when the molar ratio to be mixed of Pb:Zr:Ti is 1:0.52:0.48.

The film-producing reaction comprises a core-forming step and a crystal-growing step. In the core-forming step, Ti source is a Ti substrate. Namely, a Ti wire is added to a mixed solution of lead nitrate, zirconium oxide chloride and potassium hydroxide to form a PZT film, at generally 120° C. to 180° C. for generally 24 to 48 hours. Thereafter, in the crystal-growing step, lead nitrate, zirconium oxide chloride, titanium tetrachloride and potassium hydroxide are mixed with a predetermined molar ratio of Pb:Zr:Ti for the compounds to give the target product in formula (1). Further, the Ti wire treated in the first step is added thereto to react them at generally 100° C. to 140° C. for generally 24 to 48 hours in an autoclave. By repeating this crystal-growing step, an target thickness of a PZT film can be obtained. In this step, value of x may be controlled according to the molar ratio of Pb:Zr:Ti of the compounds in the solution to be added to the autoclave.

The advantages of forming a PZT polycrystalline film by hydrothermal synthesis method are as follows: (1) Since a film is formed in an aqueous solution, the film can he formed even for a three-dimensional structure entity; (2) By repeating the growth process, a thick film can be formed; (3) A polarization treatment is unnecessary (natural polarization); (4) Since a PZT thin film can be formed at as low a temperature as about 150° C., it is possible to lessen the influence of thermal stress generated during formation, compared with the other methods.

Besides hydrothermal synthesis method described above, extrusion molding method can be used to form a fiber having a PZT crystal layer coated on the surface of a metal wire. Namely, a binder and water are added to and kneaded with PZT powder, by an extrusion molding machine, and the kneaded mixture and a platinum wire are extruded simultaneously from a nozzle, thereby forming, first, forming a PZT fiber-molded article composed of metal core and PZT film coated on the core. The PZT fiber-molded article is dried, the binder is removed from the article by heating at 400 to 600° C. generally, and the resultant article is sintered at a high temperature around 1100° C. to 1200° C. to form a fiber coated with PZT crystals.

Herein, componds as Pb, Zr and Ti sources may be lead nitrate, zirconium oxide chloride and titanium tetrachloride solution, respectively. However, these conditions may be changed by variations of applications for actuators and sensors, producing temperatures, sizes of samples, quantities of the solutions.

According to the extrusion molding method stated above, the platinum wire is used as a core metal, as platinum is preferable not to deteriorate PZT properties. However, materials other than platinum, as replacements, can be used as long as they do not strongly react with PZT when sintering the PZT fiber-molded article at 1100° C. to 1200° C., as long as they are not oxidized and do not lose metal properties. These materials include stainless steel, nickel, titanium, and the like. However, if they are used, it is necessary to suppress the reaction with PZT as much as possible.

Herein, the binder may be selected from methyl cellulose, tragacanth gum and polyvinylalcohol. This binder is added in 10 wt % or less, more preferably 8 wt % to the PZT powder. Further, there is generally added about 1 wt % of plasticizer such as glycerol and about 5 to 20 wt % of water. For instance, 15 ml of the water may be added to 100 g of PZT powder. Still further, there can be used thermal-plastic polymer preferably derived from phthalic acid-based polymer as the binder.

First Embodiment

In a first embodiment according to the present invention, lead nitrate, zirconium oxide chloride, and titanium tetrachloride are mixed in an aqueous solution of potassium hydroxide; the resultant mixed solution is put in a pressure vessel, together with a titanium wire 1, as a film formation target, and the pressure vessel is kept at a high temperature and a high pressure, thereby causing the reaction between $Pb^{2+}$, $Zr^{4+}$ and $Ti^{4+}$ ions in the solution and the titanium wire 1. As a result of the reaction, a PZT polycrystalline film 2 grows on the surface of the titanium wire 1 to form a PZT fiber.

In more concrete, 1.0 mol/l of lead nitrate solution, 1.7 mol/l of zirconium oxide chloride solution, and 3.11 mol/l of titanium tetrachloride solution are prepared. 7 ml of the lead nitrate solution, 2 ml of the zirconium chloride solution and 12 ml of an 8 mol/l potassium hydroxide solution are mixed together with a Ti wire and reacted at preferably 150° C. for preferably 48 hours, to make course cores on the Ti wire. Thereafter, 7.27 ml of the lead nitrate solution, 1.85 ml of the zirconium oxide chloride solution, 0.89 ml of the titanium tetrachloride solution and 12 ml of a 4 mol/l potassium hydroxide solution are mixed and reacted at 120° C. and for 48 hours to make a PZT film grown on the Ti wire. The reactions are carried out in an autoclave under vapor pressure of the each solution at 150° C. and 120° C. (about 0.4 MPa at 150° C., about 0.1 MPa at 120° C.).

Figure 2:
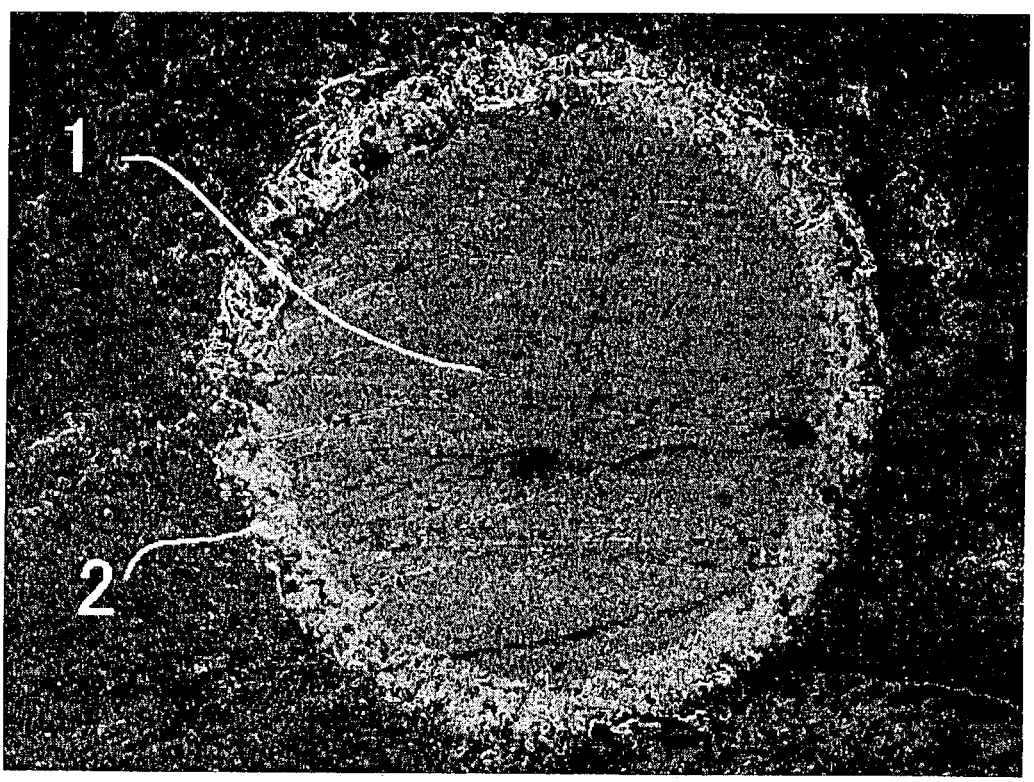
FIG. 2 is a scanning electron microscope photograph showing a cross section of the PZT fiber formed by hydrothermal synthesis method in the first embodiment according to the present invention.

FIG. 1 shows a scanning electron microscope photograph of the surface of the PZT fiber formed by hydrothermal synthesis method. FIG. 2 shows a scanning electron microscope photograph of a cross section of the PZT fiber formed by hydrothermal synthesis method. As can be seen from the photograph of the surface of the PZT fiber shown in FIG. 1, PZT crystals of 5 to 10 μm are overlaid and grown on the surface of the titanium wire 1. As can be seen from the photograph of the cross section of the PZT fiber shown in FIG. 2, a PZT thin film 2 of about 20 μm in thickness is formed on the surface of the titanium wire 1, having a diameter of 150 μm. Thus, by utilizing the film formation method by hydrothermal synthesis method, it is possible to form a PZT crystal film of about 20 μm in thickness in a wire form, which has been difficult to produce by conventional film formation methods, such as a sputtering method, a screen press method, and a sol-gel method.

Second Embodiment

In a second embodiment according to the present invention, a smart board, which has a function as a sensor or an actuator, and which is manufactured by embedding the PZT fiber formed in the first embodiment into a composite material, will be described.

Figure 3:
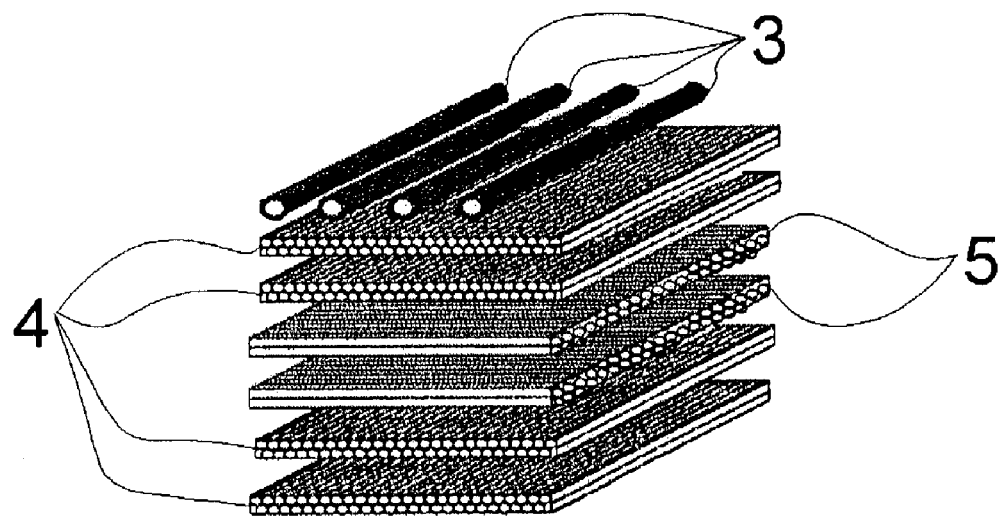
FIG. 3 is a perspective view showing a method for manufacturing a smart board in the second embodiment according to the present invention.

As shown in FIG. 3, multiple PZT fibers 3 are embedded into the surface of carbon fiber reinforced plastic (CFRP) consisting of six layers. This carbon fiber reinforced plastic is used as a conductive composite material. At this time, prepregs 4 and 5, having unidirectional carbon fibers of carbon fiber reinforced plastic, respectively, are employed, so that the two prepregs 4 and the two prepregs 5 are alternately overlaid perpendicularly to one another. The direction of the embedded PZT fibers 3 is made equal to that of the prepregs 4, thereby decreasing the influence of the embedding of the fibers on the composite material. Since PZT ceramics has a Curie point as high as 350° C., a hot press used when molding the composite material hardly influences the composite material, and the PZT fibers can be embedded into the composite material during the molding.

Figure 4:
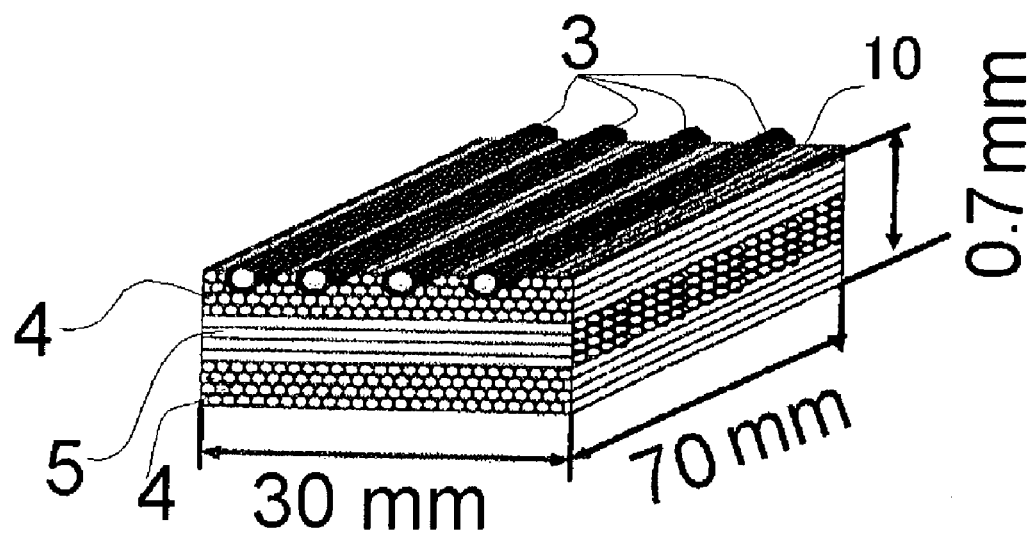
FIG. 4 is a perspective view showing the structure of the smart board in the second embodiment according to the present invention.

In the experiment conducted in the second embodiment, as shown in FIG. 4, the PZT fibers 3 are mounted on the upper surface of the six layers of prepregs 4 and 5, and pressure is applied from both upward and downward under an atmosphere of a temperature of 150° C., thereby manufacturing a cantilever structure 10 having a length of 70 mm, a width of 30 mm, and a thickness of 0.7 mm, and having the PZT fibers 3 embedded into the prepreg 4.

In this embodiment, since the smart board itself is employed as an electrode, it is possible to use a conductive composite material (CFRP) mainly consisting of carbon fibers or the like.

A piezoelectric PZT fiber is aimed to be used for composite material such as CFRP, by embedding. Therefore, the present PZT fiber is designed to have an outer diameter not longer than the thickness of one or two of CFRP prepregs (preferably in a range of 150 μm to 300 μm). The PZT fiber can be used widely by making its diameter same as that of an optical fiber (diameter: about 150 μm) which is used to detect displacements being embedded to the composite material. In hydrothermal synthesis method, a PZT thin film is formed by a chemical reaction, thereby a PZT film with a thickness of about 5 to 30 μm can be formed practically. Commercially available Ti wire has its diameter of 50 μm or more, usually. Therefore, a piezoelectric PZT fiber can be obtained to have its whole diameter of about 60 μm (Ti wire: 50 μm) to about 200 μm (Ti wire: 150 μm). Namely, very thin fiber can be produced. It is apparent that the present PZT fiber is suitable to be used as a sensor to be embedded without deteriorating the mechanical strength of the composite material. On the other hand, in extruding molding method, PZT is coated on a surface of a metal wire (e.g. platinum wire), thereby the produced PZT fiber can have its diameter of 1 to 2 mm or more, without problems. Namely, a PZT film produced by the extruding molding method is usually thicker than that by the hydrothermal synthesis method. Accordingly, the PZT fiber produced by the extruding molding method is suitable to be used as an actuator.

Third Embodiment

In a third embodiment according to the present invention, the smart board manufactured in the second embodiment is used as an actuator.

Figure 5:
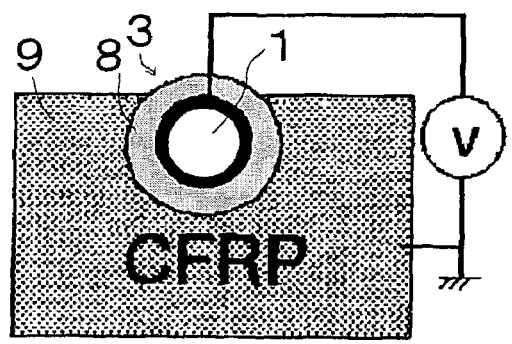
FIGS. 5(a) and 5(b) each are an explanatory view for use of the smart board as an actuator in the third embodiment according to the present invention.
Figure 5:
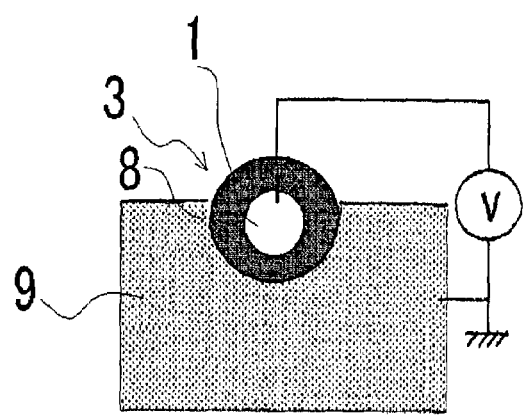

FIG. 5(*a*) shows an example of using the smart board as an actuator in this third embodiment, and FIG. 5(*b*) shows another example of using the smart board as another actuator in this third embodiment.

Figure 6:
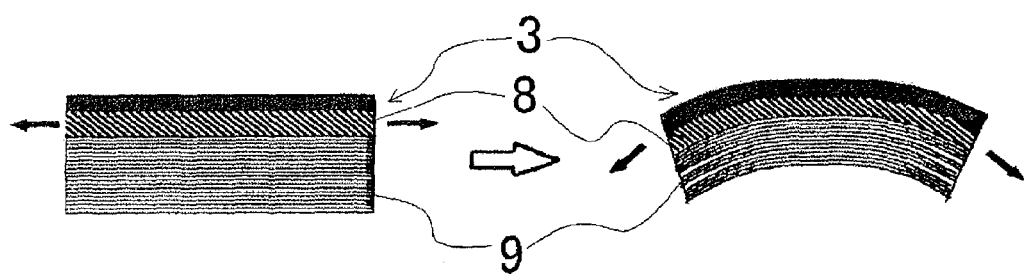
FIG. 6 is an explanatory view showing a state in which a composite material is deformed by deformation of the PZT fiber when the smart board is used as the actuator in the third embodiment according to the present invention.

As shown in FIGS. 5(*a*) and 5(*b*), a voltage is applied between the titanium wire 1 in the PZT fiber 3, and the conductive composite material 9, made of carbon fiber reinforced plastic or the like. As result, a portion 8 of the PZT crystal film having the PZT fiber embedded is expanded at a negative voltage and shrunk at a positive voltage. For example, if a positive voltage is applied, the portion 8 of the PZT crystal film having the fiber embedded is expanded as shown in the left side of FIG. 6. Following this deformation, the composite material is bent and deformed as shown in the right side of FIG. 6.

In particular, in the present invention as shown in FIG. 5(*a*), almost all of the PZT fiber can be used for a sensor or actuator by embedding it deeply to make a inner metal wire function as an electrode.

It is noted that the conductive composite material 9 is not limited to the material mainly consisting of carbon fibers but may be any other conductive composite material.

Figure 7:
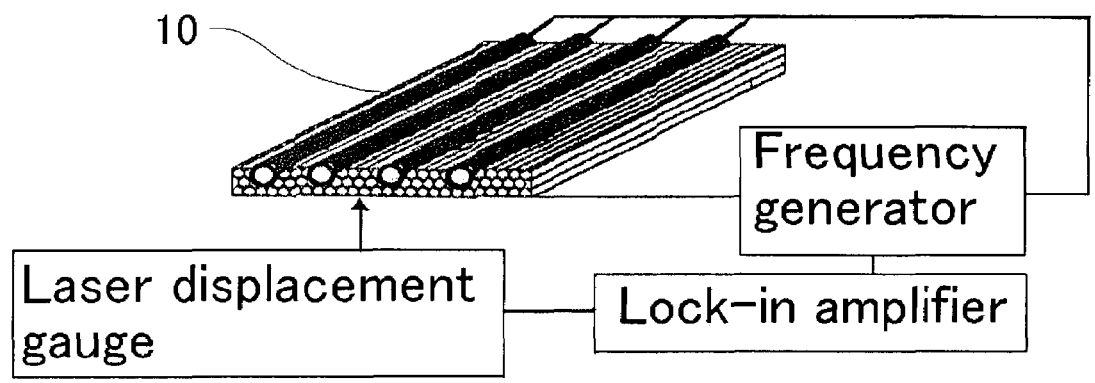
FIG. 7 is an explanatory view for use of the smart board as the actuator in the third embodiment according to the present invention.
Figure 8:
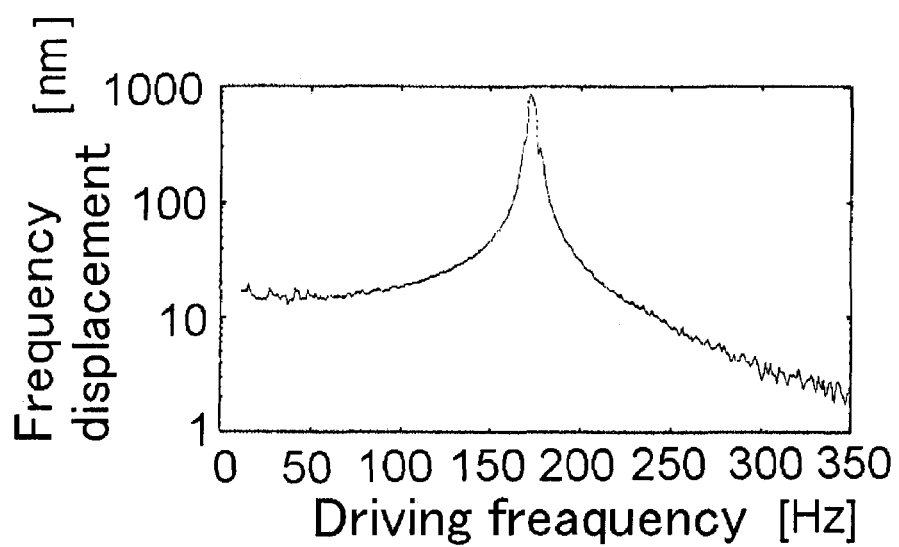
FIG. 8 shows the result of a verification experiment if the smart board is used as the actuator in the third embodiment according to the present invention.

As show in FIG. 7, in a verification experiment, one end of the cantilever structure 10 is fixed, a driving voltage (50 Vpp) is applied to the embedded four fibers, and a vibration displacement, which is generated on the tip end, is measured by a laser displacement gauge. FIG. 8 shows the relationship between driving frequency and vibration displacement. Herein, a structure which functions as a sensor or actuator is shown in, for example, Aaron A. Bent, Nesbitt W. Hagood, and John P. Rodgers 'Anisotropic Actuation with Piezoelectric Fiber Composites', Proceedings of the DGLR Conference, Germany (1993). As FIG. 8 clearly shows, the cantilever structure has a displacement of about 10 nm, and it resonates at about 180 Hz. The vibration displacement can be controlled by changing the number of embedded fibers or the driving voltage.

Fourth Embodiment

In a fourth embodiment according to the present invention, the smart board manufactured in the second embodiment is used as a sensor.

Figure 9:
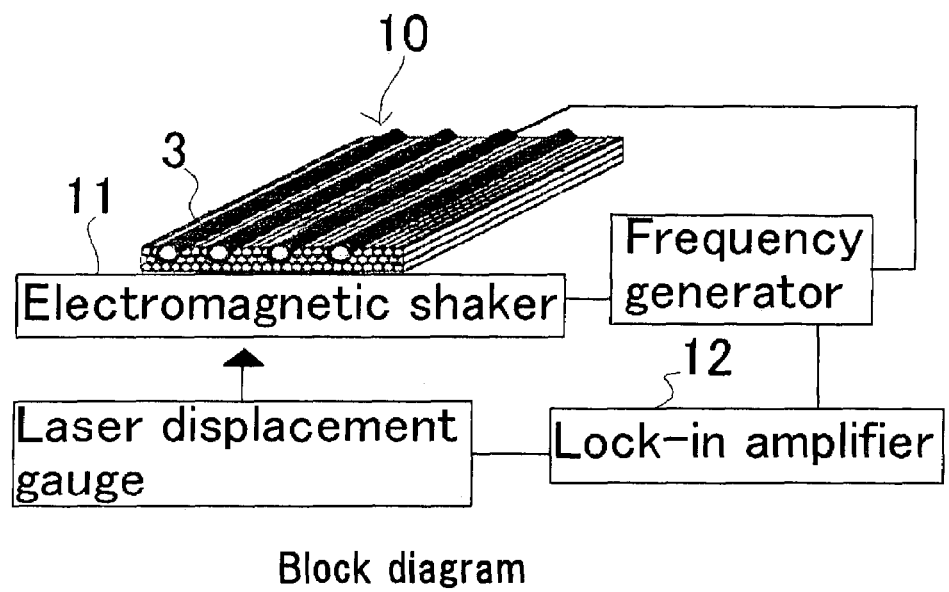
FIG. 9 is an explanatory view for use of the smart board as a sensor in the fourth embodiment according to the present invention.

The piezoelectric material has not only a reverse piezoelectric effect causing strain when applied with voltage, but also a positive piezoelectric effect generating charges when applied with this strain. Using the effects, the strain applied to the smart board can be detected. As shown in FIG. 9, an electromagnetic shaker 11 is attached to the tip end of a manufactured cantilever structure 10, to forcedly vibrate the cantilever structure 10. Specifically, the electromagnetic shaker 11 is mounted to the top end of the cantilever structure with an adhesive. The voltage output from the piezoelectric fibers 3 by the vibration is detected by a lock-in amplifier 12.

Figure 10:
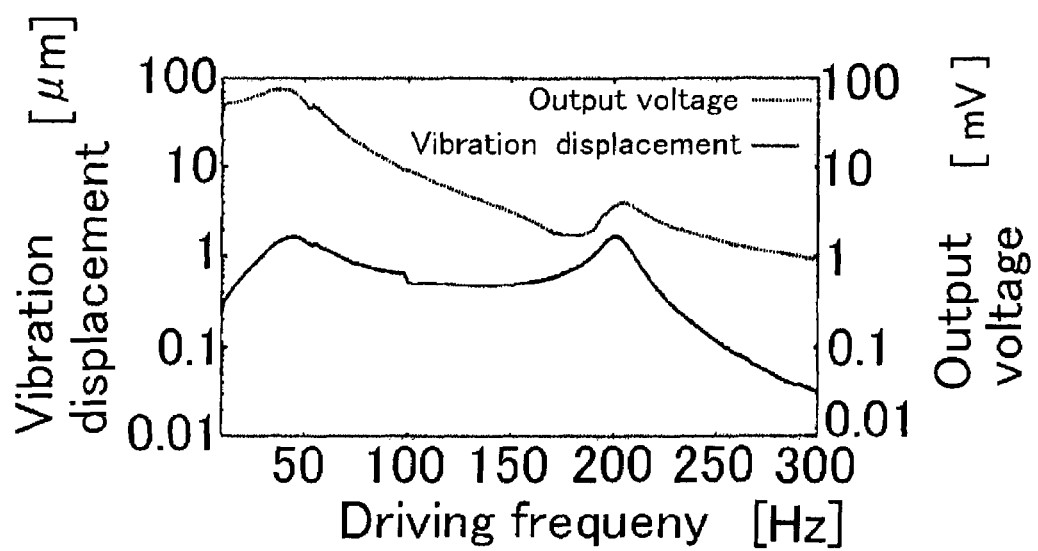
FIG. 10 shows the result of a verification experiment it the smart board is used as the sensor in the fourth embodiment according to the present invention.

FIG. 10 shows the relationship among driving frequency, vibration displacement, and output voltage from a fiber. A broken line indicates the vibration displacement caused by forced vibration using the electromagnetic shaker 11. A solid line indicates the voltage output from one embedded PZT fiber. FIG. 10 demonstrates that the vibration displacement is almost proportional to the output voltage.

Fifth Embodiment

Figure 11:
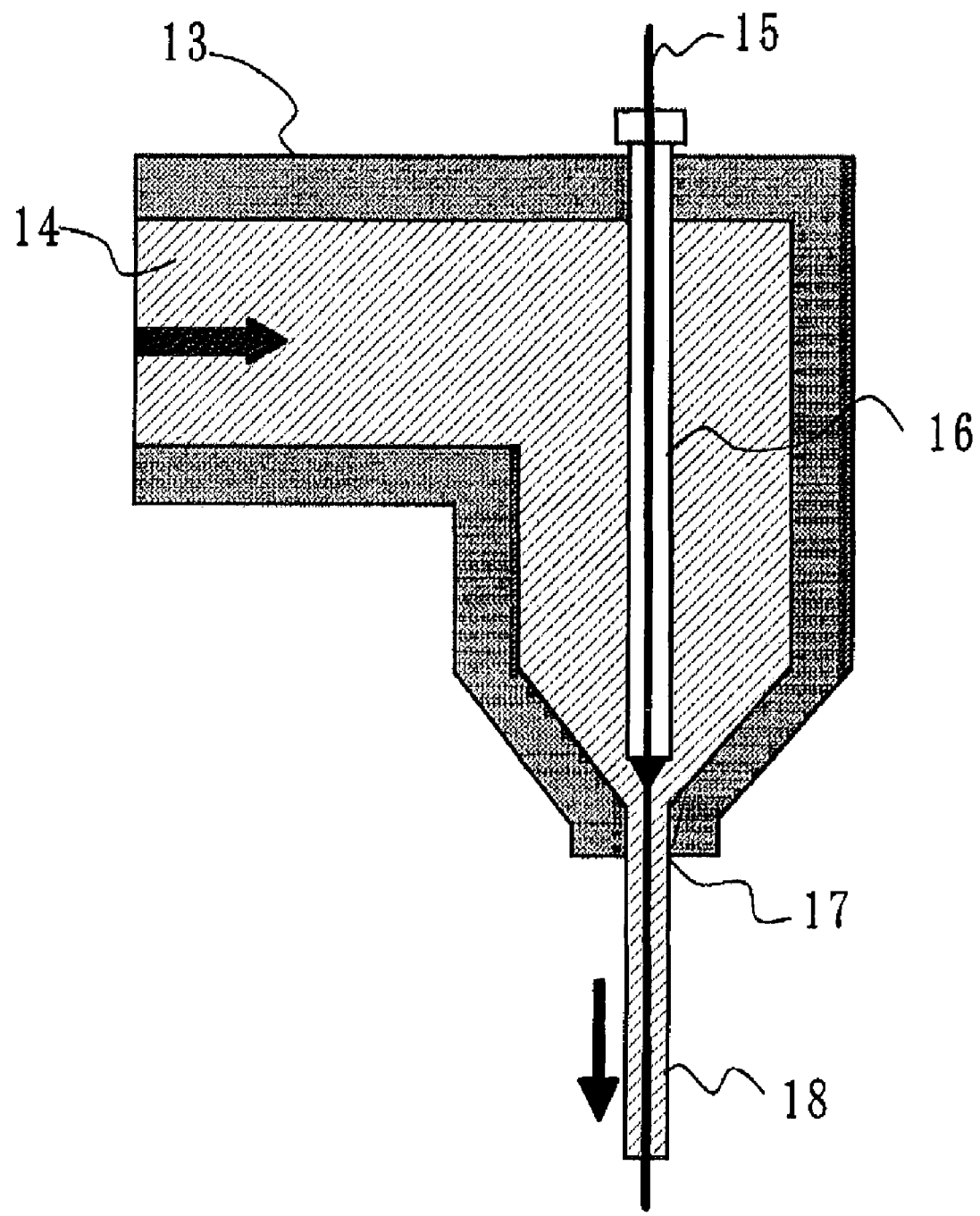
FIG. 11 is an explanatory view of forming a PZT fiber by a nozzle equipped with an extrusion molding machine in the fifth embodiment according to the present invention.

In a fifth embodiment according to the present invention, extrusion molding method is used as a method for forming a fiber having a coating of PZT crystal layer to the surface of a metal wire. Namely, using a nozzle 13, equipped with an extrusion molding machine (about 10 MPa) shown in FIG. 11, paste 14, obtained by adding an appropriate quantity of binder and water to PZT powder and by kneading them, and a platinum wire 15 (of diameter 50 $\mu$m), introduced from a wire guide 16, are simultaneously extruded from a nozzle outlet 17 (of diameter 200 $\mu$m), thereby forming a metal core-contained PZT fiber-molded article 18. Next, this PZT fiber-molded article 18 is dried, the binder is removed from the PZT fiber-molded article, and the resultant article is sintered at a high temperature of 1100° C. to 1200° C., thereby forming a PZT fiber, as a finished product.

Sixth Embodiment

Figure 12:
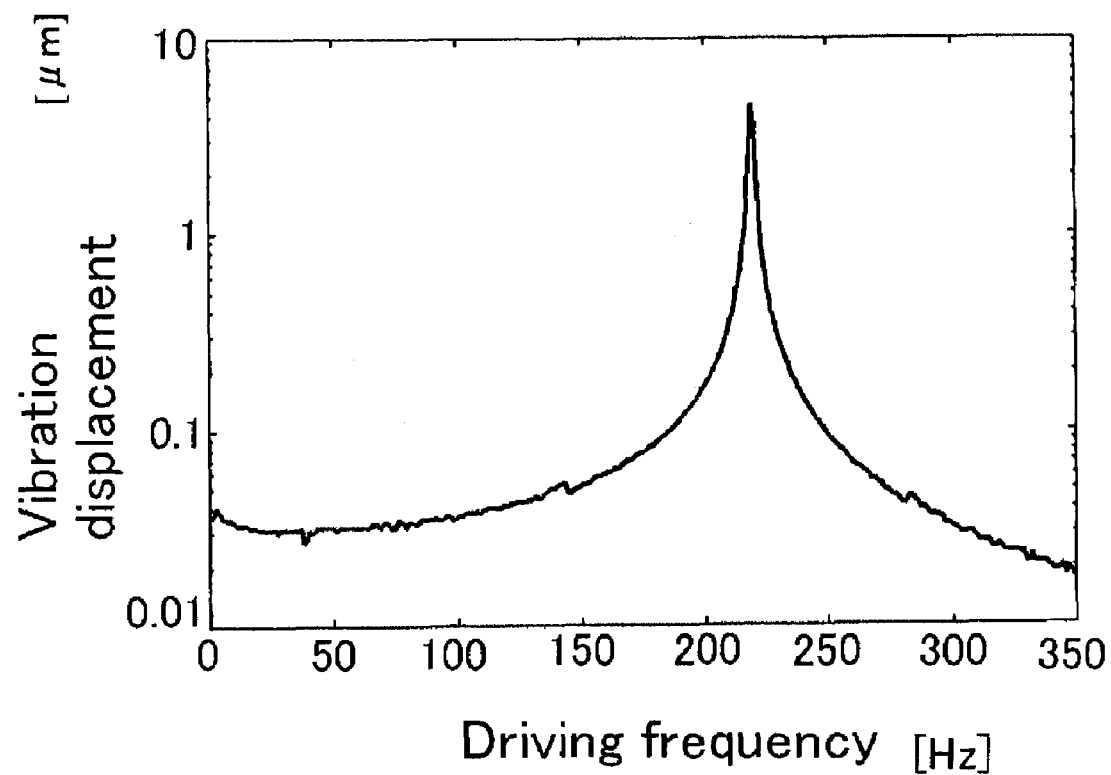
FIG. 12 shows the result of a verification experiment if the smart board is used as an actuator in the sixth embodiment according to the present invention.

In a sixth embodiment, a cantilever structure is formed using the PZT fiber obtained in the fifth embodiment, by the same method described in the second embodiment, and actuator performance is verified, by the same method described in the third embodiment. FIG. 12 shows the relationship between driving frequency and vibration displacement. FIG. 12 demonstrates that the cantilever structure has a displacement of about 20 to 30 nm in the background, and a displacement of about 5 $\mu$m with a resonance frequency of 220 Hz. As is obvious from a comparison of FIG. 12 with FIG. 8, which shows the displacement result by hydrothermal synthesis method, the fiber displacement by extrusion molding method is larger, by one figure or more, than that by hydrothermal synthesis method. Excellent actuator performance is thus verified.

Seventh Embodiment

Figure 13:
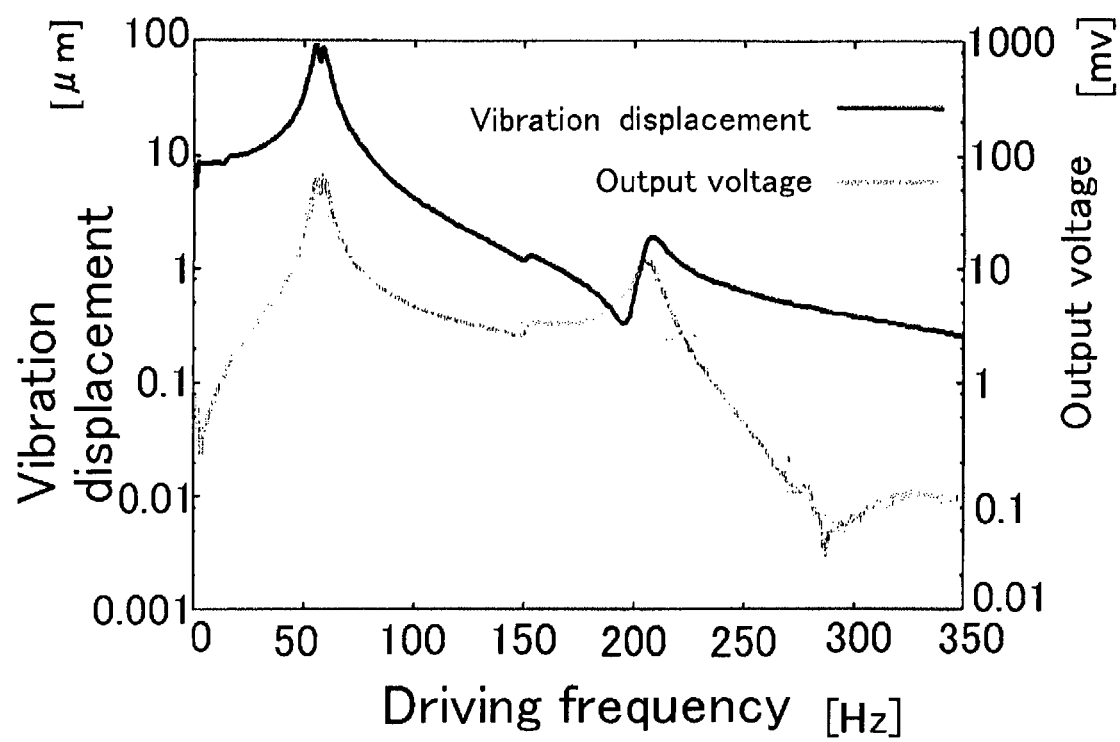
FIG. 13 shows the result of a verification experiment if the smart board is used as a sensor in the seventh embodiment according to the present invention.

In a seventh embodiment, a cantilever structure is formed using the PZT fiber obtained in the fifth embodiment, by the same method described in the second embodiment, and sensor performance is verified, by the same method described in the fourth embodiment. FIG. 13 shows the relationship among driving frequency, vibration displacement, and output voltage from the fiber. In FIG. 13, a solid line indicates the vibration displacement when the cantilever is forcedly vibrated by an electromagnetic shaker, and a broken line indicates the voltage output from one embedded PZT fiber during this displacement. It can be understood from FIG. 13 that a sensor signal is outputted corresponding to the vibration displacement. As is obvious from a comparison of FIG. 13 with FIG. 10, which shows the result by hydrothermal synthesis method, there is no great difference between the sensor performance of fiber by extrusion molding method and that by hydrothermal synthesis method.

According to the present invention, there can be provided a PZT fiber, a smart board utilizing the PZT fiber, an actuator utilizing the smart board, and a sensor utilizing the smart board, which do not need to form an inter-digital electrode, solve a cracking problem, and exhibit excellent performances by combining PZT ceramics having a strong piezoelectric effect, a titanium wire or a heat-resistant metal wire of platinum or the like, and a conductive composite material.

The present invention has the following advantages.

(1) By using PZT ceramics, having a strong piezoelectric effect, as a fiber material, and using a metal wire, such as a titanium wire, as the core wire of the fiber, it is possible to solve the problem of breaking of the ceramics fiber, resulting from the problem that the fiber is hard and tends to crack because of the properties in characteristic of ceramics, while maintaining the performance of the piezoelectric material.

(2) The PZT fiber thus formed is embedded into a conductive composite material, such as CFRP, and the composite material itself is used as an electric common ground. Therefore, it is possible to suppress electrical interference that occurs when a voltage is applied, so as to utilize the smart board as an actuator, or when a voltage is detected as a sensor. In addition, the smart board is less influenced by external noise.

(3) The metal wire such as titanium wire, serving as a core material, can be used not only as a reinforcement material for PZT ceramics but also as an electric signal line. Therefore, only by using the titanium wire in the embedding of the conductive fiber, the wire can be used as a sensor or an actuator without the need to newly create an inter-digital electrode.

(4) The piezoelectric fiber can be easily embedded into the carbon-based composite material in the process of molding a structure, such as a building, an automobile, a vessel, or an aircraft, and the embedded fiber can be used as a sensor or an actuator without the need to form another electrode or the like. Thus, it is possible to prevent fatigue failure by sensing the vibration of the structure and canceling the vibration, to prevent unstable vibration, and to improve riding quality, thereby improving the reliability of the structure and reducing maintenance cost.

(5) The PZT fiber formed by extrusion molding method has large displacement and therefore exhibits excellent performance as an actuator.

Having described our invention as related to the present embodiments, it is our intention that the invention not be limited by any of the details of the description, unless otherwise specified, but rather be construed broadly within its spirit and scope as set out in the accompanying claims.

What is claimed is:

1. A lead zirconate titanate fiber formed by coating lead zirconate titanate crystals on a surface of a titanium wire serving as a core wire, wherein the surface of the titanium wire is coated with lead zirconate titanate crystals by a hydrothermal method.

2. A lead zirconate titanate fiber formed by coating lead zirconate titanate crystals on a surface of a metal wire serving as a core wire, wherein the surface of the metal wire is coated with lead zirconate titanate crystals by extrusion molding, and wherein a resultant article from the extrusion molding is sintered.

3. The lead zirconate titanate fiber according to claim 2, wherein the metal wire is a heat-resistant metal wire.

4. The lead zirconate titanate fiber according to claim 3, wherein the heat-resistance metal wire is constituted of at least one selected from platinum, stainless steel and nickel.

5. A smart board formed by embedding the lead zirconate titanate fiber as defined in claim 1 into a conductive composite material layer.

6. A smart board according to claim 5, wherein the conductive composite material layer is constituted of a carbon fiber reinforced plastic.

7. An actuator utilizing the smart board as defined in claim 5, with the actuator being constituted by applying a voltage between the titanium wire in the lead zirconate titanate fiber and the conductive composite material layer.

8. A sensor utilizing the smart board as defined in claim 5, with the sensor being constituted by connecting a voltage sensor to the smart board.

9. A method of utilizing the smart board as defined in claim 5 as an actuator or sensor, which functions by applying a voltage between the titanium wire in the lead zirconate titanate fiber and the conductive composite material layer.

10. The smart board as defined in claim 5 as an actuator or sensor, which functions by applying a voltage between the titanium wire in the lead zirconate titanate fiber and the conductive composite material layer.

11. A smart board utilizing the lead zirconate titanate fiber as defined in claim 2, with the smart board being formed by embedding the lead zirconate titanate fiber into a conductive composite material layer.

12. A smart board according to claim 11, wherein the conductive composite material layer is constituted of a carbon fiber reinforced plastic.

13. An actuator utilizing the smart board as defined in claim 11, with the actuator being constituted by applying a voltage between the metal wire in the lead zirconate titanate fiber and the conductive composite material layer.

14. A sensor utilizing the smart board as defined in claim 11, with the sensor being constituted by connecting a voltage sensor to the smart board.

15. A method of utilizing the smart board as defined in claim 11 as an actuator or sensor, which functions by applying a voltage between the metal wire in the lead zirconate titanate fiber and the conductive composite material layer.

16. The smart board as defined in claim 11 as an actuator or sensor, which functions by applying a voltage between the metal wire in the lead zirconate titanate fiber and the conductive composite material layer.

* * * * *